Figure 1:
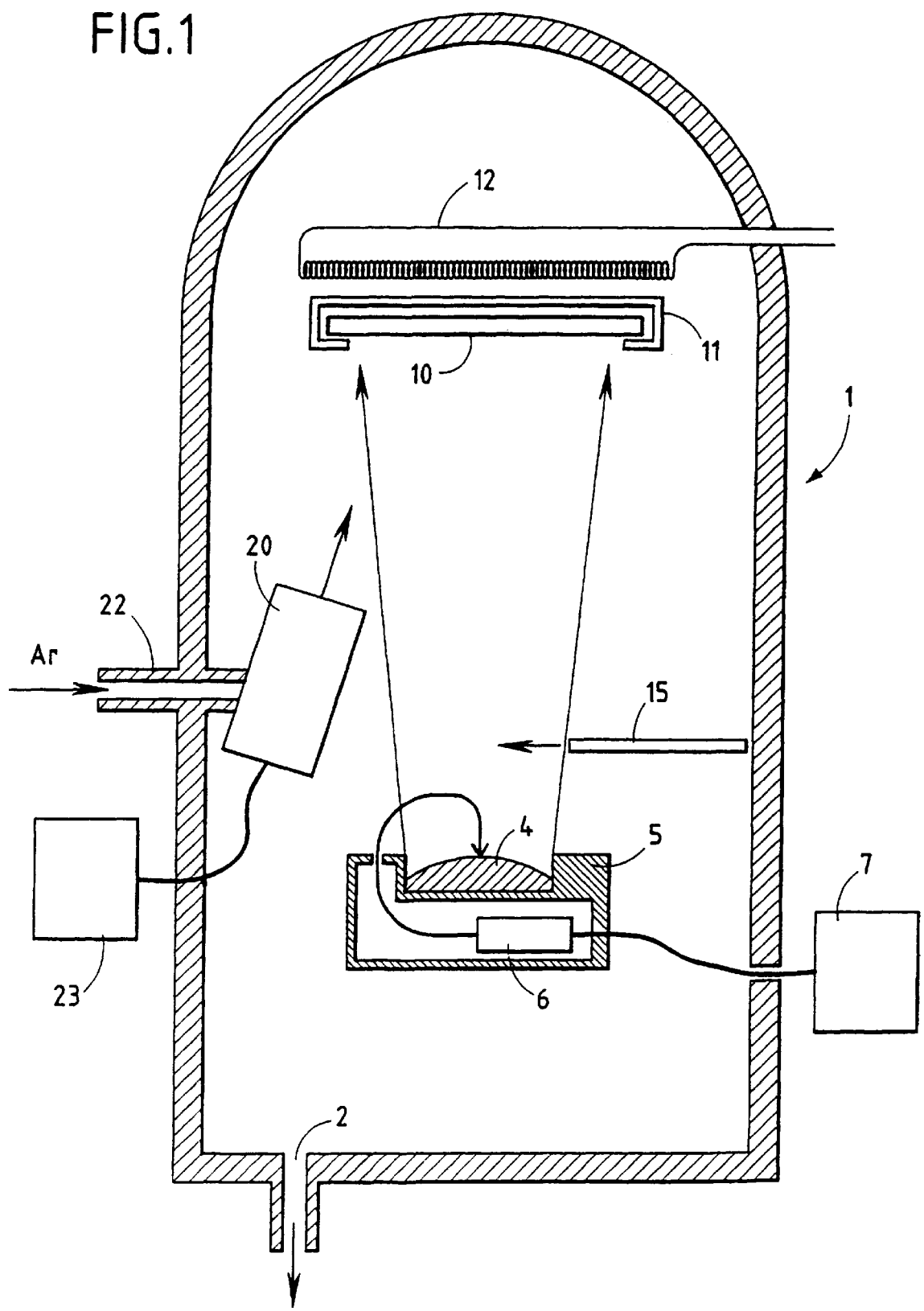

United States Patent [19]
Beguin et al.

[11] Patent Number: 6,103,318
[45] Date of Patent: *Aug. 15, 2000

[54] METHOD FOR MAKING AN OPTICAL WAVEGUIDE COMPONENT USING A LOW-STRESS SILICON PHOTOMASK

[75] Inventors: Alain M J Beguin, Vulaines sur Seine; Philippe Lehuede, Yerres, both of France

[73] Assignee: Corning Incorporated, Corning, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 09/085,339

[22] Filed: May 26, 1998

[30] Foreign Application Priority Data

Jun. 6, 1997 [FR] France ................................ 9707023

[51] Int. Cl.$^7$ .......................... B05D 5/06; C23C 14/58; C23C 14/22; C23C 14/14; C23F 1/00
[52] U.S. Cl. ...................... 427/527; 427/534; 427/567; 427/163.2; 216/24; 216/26; 216/67; 204/192.26
[58] Field of Search ................................ 427/527, 567, 427/563, 574, 578, 533, 535, 163.2, 163.4, 534; 216/24, 26, 67, 79; 204/192.26

[56] References Cited

U.S. PATENT DOCUMENTS

| | | | |
|---|---|---|---|
| 4,179,312 | 12/1979 | Keller et al. | 427/527 |
| 4,256,532 | 3/1981 | Magdo et al. | |
| 4,365,013 | 12/1982 | Ishioka et al. | 427/527 |
| 4,443,488 | 4/1984 | Little et al. | 427/527 |
| 4,581,113 | 4/1986 | Morimoto et al. | 427/527 |
| 4,619,729 | 10/1986 | Johncock et al. | 427/527 |
| 4,634,600 | 1/1987 | Shimizu et al. | |
| 4,735,677 | 4/1988 | Kawachi et al. | |
| 4,735,920 | 4/1988 | Stephani et al. | |
| 5,015,353 | 5/1991 | Hubler et al. | |
| 5,089,289 | 2/1992 | Ito | 427/527 |
| 5,098,736 | 3/1992 | Fukuda | |
| 5,391,407 | 2/1995 | Dearnaley | 427/527 |
| 5,579,424 | 11/1996 | Schneider | 216/24 |
| 5,593,719 | 1/1997 | Dearnaley et al. | 427/527 |
| 5,744,370 | 4/1998 | Nakamura | 427/527 |

FOREIGN PATENT DOCUMENTS

| | | |
|---|---|---|
| 0 265 912 | 10/1987 | European Pat. Off. |
| 0 269 112 | 11/1987 | European Pat. Off. |
| 0 434 045 A2 | 12/1990 | European Pat. Off. |
| 0 539 711 A1 | 9/1992 | European Pat. Off. |
| 0 541 388 A1 | 11/1992 | European Pat. Off. |
| 0 631 297 A2 | 6/1994 | European Pat. Off. |
| WO 88/02790 | 4/1988 | WIPO |
| WO 96/32520 | 10/1996 | WIPO |

OTHER PUBLICATIONS

Trimble, et al. "Evaluation of polycrystalline silicon membranes on fused silica for x–ray lithography masks", J. of Vacuum Science and Technology—B 7 (1989) Nov./Dec. No. 6.

Derwent Patent Abstract of Japan, J03243771, Application No. 90JP–039337, filed Feb. 20, 1990 published Oct. 30, 1991 Nippon Sheet Glass, KK.

(List continued on next page.)

Primary Examiner—Marianne Padgett
Attorney, Agent, or Firm—Philip G. Alden

[57] ABSTRACT

A method of forming a layer of silicon on a surface comprises the steps of depositing silicon on the surface by a physical deposition process such as electron beam evaporation and, during said deposition process, subjecting the forming film to ionic bombardment. The resultant silicon film has stresses which are considerably reduced compared to a film produced by an ordinary physical deposition process. This method is particularly well adapted to the formation of relatively thick silicon layers ($\geq 1$ μm) on a layer (or stack of layers) of silica, to serve as an etching mask in a subsequent deep etching of the silica by reactive ion etching.

27 Claims, 2 Drawing Sheets

OTHER PUBLICATIONS

Derwent Patent Abstract of Japan, J04069603, Application No. 90JP–182445, filed Jul. 10, 1990 pub. Mar. 4, 1992 Copal KK.

Derwent Patent Abstract of Japan, J05299361, Application No. 92JP–101330, filed Apr. 21, 1992 pub. Nov. 12, 1993 Rimes KK.

Derwent Patent Abstract of Japan, J06077208, Application No. 92JP–226242, filed Aug. 25, 1992 pub. Mar. 18, 1994 Fujitsu Ltd.

Derwent Patent Abstract of Japan, J06312467, Application No. 93JP–094967, filed Mar. 31, 1993 pub. Nov. 8, 1994 Nippon Zeon KK.

Derwent Patent Abstract of Japan, J07159972, Application No. 93JP–305628, filed Dec. 6, 1993 published Jun. 23, 1995 Fujitsu Ltd.

Derwent Patent Abstracts—Abstract of basic patent EP–489659; Abstract of European equivalent, EP–489659; Abstract of US equivalent, US 5,278,861 no date given, but Jan. 11, 1994 issued.

METHOD FOR MAKING AN OPTICAL WAVEGUIDE COMPONENT USING A LOW-STRESS SILICON PHOTOMASK

The present invention relates to the field of manufacture of optical components. More particularly, the invention relates to a method of forming a relatively thick silicon layer on a surface, notably for providing a silicon mask on one or several silica layers which are to be subjected to reactive ion etching.

In the field of planar integrated optics, during the manufacture of planar optical components it is often necessary to etch layers of silica (either pure silica or doped silica) so as to define the optical components. Very precise patterning is required in order to achieve the tracing of the optical devices such as, for example waveguides, gratings, lenses, etc. included in the component. Furthermore, it is often necessary to deposit and pattern successive silica layers one on top of the other (typically a core layer and one or more overclad layers).

In fabrication of such silica-based optical components the patterning of the silica layers is preferably achieved using reactive ion etching in order to obtain the desired degree of precision (resolution) of the formed devices. The quality of the etching is greatly affected by the material used to form the etching mask.

Different kinds of mask material have been used for this etching process: such asaluminium, titanium, chrome, nickel, photoresist or silicon. Metallic masks generally do not give satisfactory results for two reasons. Firstly, during the deposition of the mask layer metallic grains are grown which, during the subsequent etching step, produce roughness of the sidewalls of the etched cavities (typically excursions of >0.1 $\mu$m from the desired plane of the sidewall). Such roughness causes optical losses when the optical device is used. This problem is particularly pronounced in the case of aluminium masks. Secondly, during the reactive ion etching of the silica, sputtering of the metallic mask material takes place. Because the metallic atoms are not volatile they redeposit around the etched area and lead, once again, to roughness problems. Photoresist, and polymer masks in general, have three main disadvantages where deep etching of silica is required. Firstly, the etching selectivity ratio between the silica and the polymer mask is low (around 2:1), such that it is necessary to provide a thick mask layer if it is desired to deep etch the silica. Use of polymer layers thicker than around 7 $\mu$m leads to a loss in etching resolution. Secondly, during the etching process the polymer material flows and thus distorts the etched pattern. Thirdly, in the case of use of a polymer mask, the power density useable during the etching process is limited, thus lengthening the time necessary for accomplishing the etching.

In order to solve the above-mentioned problems it is necessary to provide a mask material which combines the contradictory properties of having a good resistance to the etching conditions while yet being volatile in the plasma. Silicon meets these requirements. Silicon has already been used as a mask material to permit reactive ion etching of silica in the fabrication of electronic components. Selectivities of around 10:1 are obtained.

Now, when it is sought to use silicon as a mask material for the etching of silica for fabrication of optical components it is often necessary to perform a deep etching of the silica layer (or layers), such that a silicon mask layer of >1 $\mu$m would be necessary. However, when it is sought to form a silicon layer of such thickness on silica using conventional physical vapour deposition techniques of evaporation under vacuum, the resultant silicon layer has high stresses. When the silicon layer is deposited using electron beam evaporation, tensile stresses of 400 MPa are encountered. When the silicon layer is deposited by sputtering, a compressive stress of around 400 MPa is measured and higher grain sizes are produced (causing roughness of the etched sidewalls). These high stresses provoke a warping of the wafer, which leads to imprecision during the lithography step. In the case of a 2 $\mu$m thick silicon layer, the stresses are so great that cracks are created in the optical layers, leading to the destruction of the components.

The preferred embodiments of the present invention provide a method of forming a silicon layer, especially a silicon layer >1 $\mu$m thick, such that the stresses in the formed layer are controlled to an acceptable level. More particularly, the present invention provides: a method of forming a layer of silicon on a surface, comprising the step of depositing silicon on said surface by a physical deposition process and, during said deposition process, subjecting the forming film to an ionic bombardment.

It has been found that, when a silicon layer is formed on a surface using a physical deposition process, and the forming layer is subjected to bombardment by an ion beam, stresses in the resulting silicon layer can be considerably reduced, even in the case of forming a relatively thick silicon layer on a layer (or several layers) of silica.

In preferred embodiments of the invention, the basic physical deposition process is electron beam evaporation. This technique permits close control of the deposition process and, in association with the ion bombardment of the forming film, allows precise tailoring of the properties of the silicon layer.

Application of the method of the present invention in the formation of a silicon mask on a silica layer enables reactive ion etching to be used for deep etching of the silica whereby to obtain high etching resolution while avoiding problems of sidewall roughness. In addition, during use of this technique for forming multiple patterned silica layers one on top of the other it has been confirmed that the warping of the wafer was reduced. Furthermore, normal power densities can be used during the reactive ion etching such that the etching process is not unduly lengthened.

Further features and advantages of the present invention will become apparent from the following description of a preferred embodiment thereof, given by way of example, illustrated by the accompanying drawings, in which:

FIG. 1 is a schematic representation of an apparatus suitable for putting into practice the method of the present invention; and FIG. 2 illustrates a fabrication process of a patterned silica layer, in which process a silicon mask is made by the method of the present invention, FIGS. 2A to 2H illustrating different steps of the fabrication process.

A preferred embodiment of the present invention will now be described with reference to FIG. 1. In this embodiment of the invention, an electron beam evaporation process is used to liberate silicon atoms from a source for deposition on a silica layer (or stack of layers), the latter being formed on a substrate, typically made of silica. At the same time, argon ions are projected towards the substrate so as to bombard the silicon film which is in the process of being formed.

As illustrated in FIG. 1, the method according to the invention is performed in a vacuum chamber 1, the vacuum being maintained by a pump (not shown) via an orifice 2. Silicon 4 is provided in a crucible 5 which serves as the anode of an electron gun 6. The current produced by the electron gun is controlled by an electron gun control unit 7. Electrons from the electron gun are accelerated towards the silicon and heat it so as to cause evaporation of silicon atoms. The evaporated silicon atoms condense on the walls of the vacuum chamber and on a silica layer present on the surface of a substrate 10, for example made of silica, provided on a substrate holder 11 towards the top of the vacuum chamber (upward evaporation is preferred so as to avoid contamination of the surface by dust). Even though, according to the process of the invention, it is not essential to heat the substrate, a heater 12 can be provided so as to enable the temperature of the substrate to be maintained, for example at 100° C., whereby to promote bonding of the deposited silicon atoms to the silica layer. A movable shutter 15 is provided in the vacuum chamber so as to enable the deposition of silicon atoms on the silica layer to be interrupted as desired.

So far, the structure of the apparatus is the same as in conventional apparatus used for electron beam evaporation of silicon. However, in addition to the above-described components, the apparatus of FIG. 1 also includes an ion gun 20 arranged to project an ion beam towards the substrate 10. In this example, the ion gun was one of "Plasmion" brand, but other ion guns can be used instead. The ion gun is supplied with argon gas via an inlet 22 and produces argon ions ($Ar^+$) which impact on the substrate at approximately 30° to the direction of impact of the arriving silicon atoms. The ion beam current and energy are controlled by an ion gun control unit 23.

The method according to the preferred embodiment of the invention will now be described. The silicon source 4 is placed in the crucible 5 arranged in the vacuum chamber 1, and one or more substrates 10 are arranged in the holder 11. The vacuum chamber is then evacuated via orifice 2. The ion gun 20 is then activated and, when it has attained a stable operating state (typically after several minutes), the electron gun 6 is activated so as to begin evaporation of the silicon. When the evaporation has attained a stable condition then the shutter 15 is displaced, so as to leave a free path between the silicon source and the substrate 10. In this way, silicon atoms impinge on and adhere to the silica layer present at the surface of the substrate 10 and the forming silicon film is bombarded by argon ions.

The progression of the film-formation process can be monitored, for example by providing a piezo-electric device attached to the substrate holder 11. The oscillation frequency of the piezo-electric device changes as the quantity of deposited silicon increases. When a desired quantity of silicon has been deposited, the shutter 15 is moved back into the position blocking the arrival of silicon atoms at the substrate, and the ion gun 22 is deactivated.

The stresses measured in the silicon layer produced by the process of the present invention depend upon the ratio between the number of silicon atoms and the number of argon ions, respectively, arriving at the external layer present on the substrate, during the deposition of the silicon. In the case where less than one ion arrives at the substrate (or, more precisely, the external surface present on the substrate) for each 10 silicon atoms, the stress reduction obtained relative to the results obtained by conventional processes is minor (less than 20%). This reduction becomes more significant for ratios of 1 ion per 10 silicon atoms arriving at the substrate, and upwards. Preferably, the operating conditions are fixed in order to ensure a ratio beyond 1 ion per 10 atoms and, even more preferably, of the order of 2 ions per 10 silicon atoms arriving at the substrate. Under these conditions, the stresses measured in the silicon layer can be brought below 200 MPa for a layer 1 micron in thickness, 400 MPa for a layer of 2 microns, etc.

The numbers of ions and atoms arriving at the external surface provided on the substrate depend, respectively, on the currents of the ion gun 20 and of the electron gun 6 and are, thus, easily controllable. Moreover, the optimal ratio between numbers of ions and atoms arriving at the external surface present on the substrate varies with the nature of the ions used in the ionic bombardment.

The model of ion gun used in the experiments produced a maximum current of 12 mA. Typically, the flow rate of argon to the ion gun was 1.5 to 3 sccm, the ion energy was in the range 50 eV to 100 eV, the density of ion current was 1 to 2 mA per $cm^2$ at the outlet of the ion gun, with total ion current being 10 to 12 mA. Under such conditions it was possible to maintain high rates of silicon deposition, typically around 10 to 20 Å/second. However, an ion gun withstanding higher currents would have enabled even higher silicon deposition rates to be attained and/or the same silicon deposition rate to be maintained on a wafer having a greater surface area.

The model of ion gun used in the experiments was very efficient, which enabled a very weak flow of gas and, thus, to maintain a low operating pressure in the vacuum chamber (typically around 1 to $2\times10^{-4}$ Torr).

The ions used for bombarding the forming silicon film had an energy in the range 50 eV to 100 eV. Ion energies that are too high do not enable the advantages of the invention to be obtained but, on the contrary, lead to the ejecting of silicon atoms from the layer which it is sought to create.

The method according to the present invention was put into practice as described above in order to form a 1 $\mu$m thick film of silicon on a silica layer formed on a 4 inch diameter silica wafer of 1 mm thickness. During this process of depositing silicon, 2 argon ions arrived at the substrate for every 10 silicon atoms. The stresses measured in the silicon film were 100 MPa. This represents a considerable reduction in stress compared with the stresses of 400 MPa which arise in a comparable silicon film formed by ordinary electron beam evaporation. Because of this stress reduction, the method of the present invention makes it possible to form on a silica layer thicker silicon films than were heretofore possible. For example, it now becomes feasible to form a 2 $\mu$m thick silicon layer on a silica layer without the creation of cracks. This makes it possible to form thick silicon masks ($\geq 1$ $\mu$m) on silica for subsequent patterning of the silica by reactive ion etching.

There will now be described, with reference to FIG. 2, a typical process for patterning a silica layer by reactive ion etching, which includes a step of forming a silicon mask layer by the method according to the present invention.

Figure 2A:
Figure 2B:
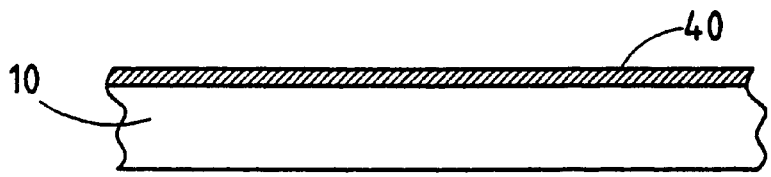
Figure 2C:
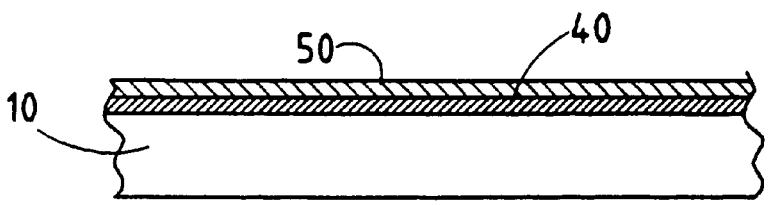
Figure 2D:
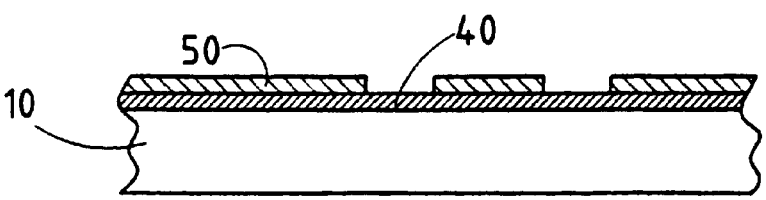
Figure 2E:
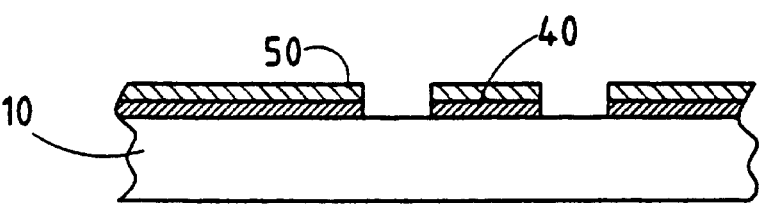
Figure 2F:
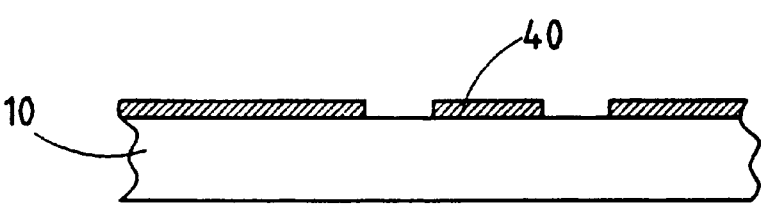

FIG. 2A shows a silica wafer 10 coated with a silica layer produced by conventional techniques. The surface on which it is intended to deposit the etching mask is prepared as usual. Next, as indicated in FIG. 2B, a silicon layer 40 is deposited on the silica layer as described above in relation to FIG. 1. Where deep etching of the silica is necessary, this silicon layer 40 may be $\geq 1$ $\mu$m thick. As indicated in FIGS. 2C and 2D, respectively, next a photoresist 50 is coated onto the silicon layer 40, and then the photoresist is exposed and developed so as to expose selected areas of the underlying silicon layer. The exposed portions of the silicon layer are etched away, for example, by a reactive ion etching using $SF_6$ (FIG. 2E) and then the remaining portions of photoresist are removed by oxygen plasma ashing (FIG. 2F). The silicon mask is now fully formed.

Figure 2G:
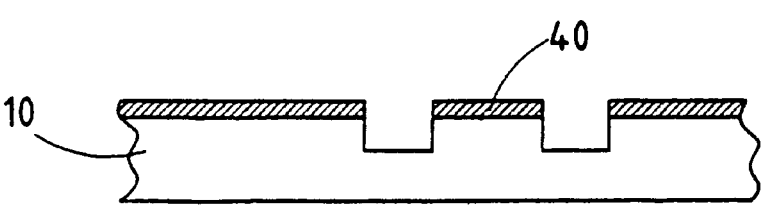
Figure 2H:
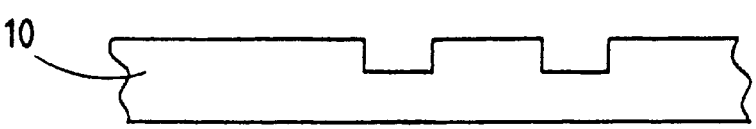

The silica layer present on the surface of the substrate 10 is etched through the silicon mask by a reactive ion etching (FIG. 2G). The selectivity of the etching process is enhanced by using a fluorine-deficient plasma (achieved by trapping fluorine atoms using a hydrogen-rich or carbon-rich plasma). Typical etching gases for this purpose are gases such as $CHF_3$, $C_2F_6$ or $C_3F_8$. Once the silica layer has been etched, the remains of the silicon mask are removed, for example by reactive ion etching using $SF_6$ (FIG. 2H).

It has been found that when the silicon layer 40 used for mask formation in the above-described silica patterning process is formed by the method according to the present invention the selectivity of the silica etching step is enhanced by about 10%. This is yet another factor which facilitates deep etching of silica. Furthermore, the quality of the etching is improved, not just due to the increase in selectivity, but also due to the improved smoothness (planarity) of the layers. Moreover, it has been verified that during the fabrication of optical components demanding deep etching, for example in the case of etching a stack of silica layers formed on a wafer, use of the process according to the invention for creating silicon masks considerably reduces the warping of the wafer. This enables the resolution of the lithography to be improved thanks to the improved planarity which is obtained.

The present invention is particularly suited to application in creation of relatively thick silicon masks for use in the fabrication of silica-based optical components incorporating optical devices such as microlenses and gratings.

Although the present invention has been described above with reference to one particular preferred embodiment, it is to be understood that numerous modifications and adaptations can be made without departing from the invention as defined in the annexed claims. In particular, although the physical deposition process used in the preferred embodiment is electron beam evaporation, other physical deposition processes, such as sputtering, can be used instead (in association with the ion bombardment of the forming film).

Similarly, although in the preferred embodiment of the invention the ions used for the bombardment are argon ions, there are other possibilities. For example, other inert gas ions may be used in place of the argon, either individually or mixed with another inert gas (ions of greater atomic mass being preferred), ions of other materials (such as hydrogen) can be mixed with the ions of the inert gas(es) or, in certain cases, the inert gas ions can be replaced by ions of another material.

Furthermore, although in the above-described embodiments the method of the present invention is used to form a silicon layer on a silica layer present at the surface of a silica substrate, this silica layer can very well be formed on a substrate of another material, such as silicon.

What is claimed is:

1. A method for making an optical waveguide component having a silica substrate and an optical pattern formed therein, the method comprising the steps of:
    depositing a mask layer of silicon on the silica substrate, the mask layer having a thickness of 1 μm or greater;
    bombarding the mask layer with ions while depositing the mask layer so as to reduce a compressive stress or a tensile stress or both in the mask layer which would otherwise warp or crack the silica substrate or the mask layer, either the compressive stress or the tensile stress or both being generally equal to or less than 200 MPa per micron of the thickness of the mask layer; and
    etching the mask layer to define the optical pattern in the silica substrate.

2. The method of claim 1 wherein the step of depositing the mask layer is performed using a physical deposition process of electron-beam assisted evaporation.

3. The method of claim 1 wherein the ions bombarding the mask layer are argon ions.

4. The method of claim 1 wherein the mask layer is formed from silicon atoms, and further wherein during the steps of depositing the mask layer and bombarding the mask layer, the ions and the silicon atoms define a ratio of 1:10 or greater relative to one another.

5. The method of claim 4 wherein the ratio of the ions to the silicon atoms is 2:10 or greater.

6. The method of claim 1 wherein the ions have an energy in the range of 50–100 eV.

7. The method of claim 1 wherein the ions bombarding the mask layer are an inert gas.

8. The method of claim 7 wherein the ions bombarding the mask layer include ions of hydrogen mixed with the ions of the inert gas.

9. The method of claim 8 wherein the ions of the inert gas are argon ions.

10. The method of claim 1 wherein only the tensile stress is generally equal to or less than 200 MPa per micron.

11. The method of claim 1 wherein only the compressive stress is generally equal to or less than 200 MPa per micron.

12. The method of claim 1 wherein the compressive stress and the tensile stress are both generally equal to or less than 200 MPa per micron of the thickness of the mask layer.

13. The method of claim 1 wherein the optical pattern is a waveguide.

14. The method of claim 1 wherein the optical pattern is a selected from a group consisting of a waveguide, a grating, or a lens.

15. The method of claim 1 wherein the optical pattern is formed as an optical characteristic within the silica substrate.

16. The method of claim 1 wherein the silica substrate defines a core region or an overclad region or both.

17. The method of claim 1 wherein the silica substrate is a doped silica.

18. The method of claim 1 wherein the compressive stress or the tensile stress or both in the mask layer would otherwise cause the mask layer to warp the silica substrate absent the step of bombarding the mask layer with ions.

19. A method for making an optical waveguide component having a silica substrate and an optical pattern therein, the method comprising the steps of:
    depositing a mask layer of silicon directly on the silica substrate by a physical deposition process to a thickness of 1 μm or greater;
    bombarding the mask layer with ions of an inert gas while depositing the mask layer so as to reduce a compressive stress or a tensile stress or both in the mask layer which would otherwise warp or crack the silica substrate to 200 MPa or less per micron of the thickness of the mask layer, thereby forming a relatively thick, low stress, single layer mask for etching; and
    etching the mask layer to define the optical pattern in the silica substrate.

20. The method of claim 19 wherein the ions of the inert gas are argon atoms.

21. The method of claim 19 wherein the ions of the inert gas have an energy in the range of 50–100 eV.

22. The method of claim 19 wherein the silica substrate is a doped silica.

23. The method of claim 19 wherein the silica substrate defines either a core region or a cladding region or both.

24. The method of claim 19 wherein the optical pattern is a waveguide.

25. The method of claim 19 wherein the optical pattern is a selected from a group consisting of a waveguide, a grating, or a lens.

26. The method of claim 19 wherein the optical pattern is formed as an optical characteristic within the silica substrate.

27. The method of claim 19 wherein the physical deposition process includes electron-beam assisted evaporation.

* * * * *